(12) United States Patent
Rofougaran et al.

(10) Patent No.: US 8,509,356 B2
(45) Date of Patent: *Aug. 13, 2013

(54) METHOD AND SYSTEM FOR BLOCKER AND/OR LEAKAGE SIGNAL REJECTION BY DC BIAS CANCELLATION

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 626 days.

This patent is subject to a terminal disclaimer.

(21) Appl. No.: 11/864,754

(22) Filed: Sep. 28, 2007

(65) Prior Publication Data
US 2008/0232512 A1  Sep. 25, 2008

Related U.S. Application Data

(60) Provisional application No. 60/895,698, filed on Mar. 19, 2007.

(51) Int. Cl.
*H04L 27/06* (2006.01)

(52) U.S. Cl.
USPC ............ 375/340; 375/346; 375/350; 375/319

(58) Field of Classification Search
USPC .................. 375/340, 346, 350, 319
See application file for complete search history.

(56) References Cited

U.S. PATENT DOCUMENTS

| | | | |
|---|---|---|---|
| 7,336,937 B2 * | 2/2008 | Tervaluoto et al. | 455/232.1 |
| 2002/0163391 A1 * | 11/2002 | Peterzell | 331/25 |
| 2003/0181186 A1 * | 9/2003 | Sorrells et al. | 455/296 |
| 2003/0199264 A1 * | 10/2003 | Holenstein et al. | 455/324 |
| 2007/0099588 A1 * | 5/2007 | Konchistky | 455/190.1 |

* cited by examiner

*Primary Examiner* — Kabir A Timory
(74) *Attorney, Agent, or Firm* — Farjami & Farjami LLP

(57) ABSTRACT

Methods and systems for blocker and/or leakage signal rejection by DC bias cancellation are disclosed and may include undersampling a received signal including a desired signal and an undesired signal. A biasing current in the wireless system may be utilized to reduce a measured DC signal generated by the undersampling of the received signal. The received signal may be undersampled at a frequency of or an integer sub-harmonic of the undesired signal, which may include a leakage signal and/or a blocker signal. The DC biasing current may be controlled utilizing successive approximation, control logic and a digital to analog converter. The output DC voltage may correspond to said undesired signal, and the received signal may be undersampled utilizing a mixer.

14 Claims, 7 Drawing Sheets

METHOD AND SYSTEM FOR BLOCKER AND/OR LEAKAGE SIGNAL REJECTION BY DC BIAS CANCELLATION

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for blocker and/or leakage signal rejection by DC bias cancellation.

BACKGROUND OF THE INVENTION

In 2001, the Federal Communications Commission (FCC) designated a large contiguous block of 7 GHz bandwidth for communications in the 57 GHz to 64 GHz spectrum. This frequency band may be used by the spectrum users on an unlicensed basis, that is, the spectrum is accessible to anyone, subject to certain basic, technical restrictions such as maximum transmission power and certain coexistence mechanisms. The communications taking place in this band are often referred to as '60 GHz communications'. With respect to the accessibility of this part of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. For example, 60 GHz signals may provide markedly different communications channel and propagation characteristics, not least due to the fact that 60 GHz radiation is partly absorbed by oxygen in the air, leading to higher attenuation with distance. On the other hand, since a very large bandwidth of 7 GHz is available, very high data rates may be achieved. Among the applications for 60 GHz communications are wireless personal area networks, wireless high-definition television signal, for example from a set top box to a display, or Point-to-Point links.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for blocker and/or leakage signal rejection by DC bias cancellation, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for blocker and/or leakage signal rejection by DC bias cancellation. Exemplary aspects of the invention may comprise undersampling a received signal comprising a desired signal and an undesired signal. A biasing current in the wireless system may be utilized to reduce a measured output DC voltage generated by the undersampling of the received signal. The received signal may be undersampled at a frequency of or an integer sub-harmonic of the undesired signal, which may comprise a leakage signal and/or a blocker signal. The DC biasing condition may be controlled utilizing successive approximation, control logic and a digital to analog converter. The output DC voltage may correspond to the undesired signal, and the received signal may be undersampled utilizing a mixer.

Figure 1:
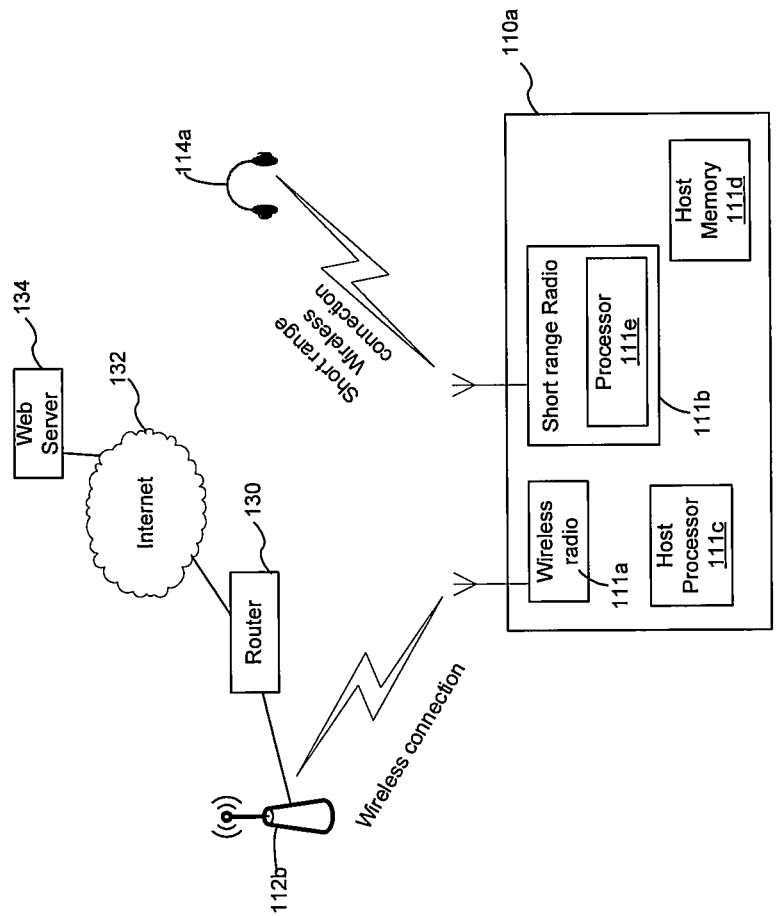
FIG. 1 is a diagram illustrating an exemplary wireless communication system, in accordance with an embodiment of the invention.

FIG. 1 is a diagram illustrating an exemplary wireless communication system, in accordance with an embodiment of the invention. Referring to FIG. 1, there is shown an access point 112b, a computer 110a, a headset 114a, a router 130, the Internet 132 and a web server 134. The computer or host device 110a may comprise a wireless radio 111a, a short-range radio 111b, a host processor 111c, a host memory 111d and a processor 111e. There is also shown a wireless connection between the wireless radio 111a and the access point 112b, and a short-range wireless connection between the short-range radio 111b and the headset 114a.

Frequently, computing and communication devices may comprise hardware and software to communicate using multiple wireless communication standards. The wireless radio 111a may be compliant with a mobile communications standard, for example. There may be instances when the wireless radio 111a and the short-range radio 111b may be active concurrently. For example, it may be desirable for a user of the computer or host device 110a to access the Internet 132 in order to consume streaming content from the Web server 134. Accordingly, the user may establish a wireless connection between the computer 110a and the access point 112b. Once this connection is established, the streaming content from the Web server 134 may be received via the router 130, the access point 112b, and the wireless connection, and consumed by the computer or host device 110a. The processor 111e may control signal processing, clock signals and delays, for example, in the short range radio 111b.

It may be further desirable for the user of the computer 110a to listen to an audio portion of the streaming content on the headset 114a. Accordingly, the user of the computer 110a may establish a short-range wireless connection with the headset 114a. Once the short-range wireless connection is established, and with suitable configurations on the computer enabled, the audio portion of the streaming content may be consumed by the headset 114a. In instances where such advanced communication systems are integrated or located within the host device 110a, the radio frequency (RF) generation may support fast-switching to enable support of multiple communication standards and/or advanced wideband systems like, for example, Ultrawideband (UWB) radio. Other applications of short-range communications may be wireless High-Definition TV (W-HDTV), from a set top box to a video display, for example. W-HDTV may require high data rates that may be achieved with large bandwidth communication technologies, for example UWB and/or 60-GHz communications.

Undersampling and dynamic bias control may be utilized to remove blocker signals and/or leakage from clock signals in 60 GHz wireless systems. Leakage signals may be reduced and/or eliminated by undersampling a received signal at a frequency that may be equal to or an integer sub-harmonic of the blocker/leakage signal and dynamically controlling the DC bias at the output of the undersampling process. By minimizing the DC level, or adjusting to a nominal value, the blocker/leakage signal may be reduced and/or eliminated.

Clock signals utilized in the computer 110a may leak into the signal received by the short range radio 111b. In addition, signals from other wireless devices in close proximity to the short range radio 111b may cause interference signals, or blocker signals that may be inadvertently picked up by the short range radio 111b. Undersampling and dynamic bias control may be utilized to reduce and/or eliminate these unwanted signals.

Figure 2:
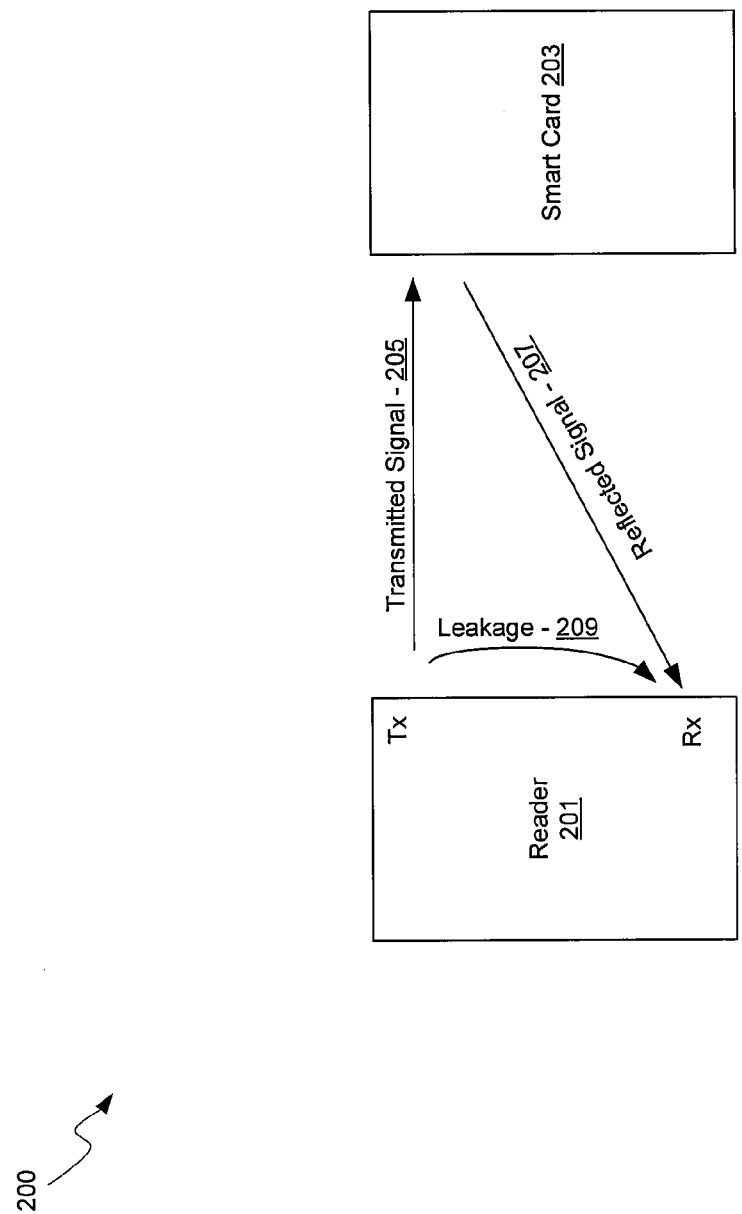
FIG. 2 is a block diagram of en exemplary wireless system with a leakage signal, in accordance with an embodiment of the invention.

FIG. 2 is a block diagram of en exemplary wireless system with a leakage signal, in accordance with an embodiment of the invention. Referring to FIG. 2, there is shown a wireless system application 200 comprising a reader 201 and a smart card 203. There is also shown a transmitted signal 205, a reflected signal 207 and a leakage signal 209.

The reader 201 may comprise suitable circuitry, logic and/or code that may enable the transmission and reception of wireless signals for short range communications. The reader may be incorporated in a point-of-sale system, such as a payment system in a gas pump at a service station, for example. The frequency of transmission may be high, 60 GHz, for example, such that the range of the signal may be small, less than a meter, for example.

The smart card 203 may comprise suitable circuitry, logic and/or code that may enable modulation and reflection of received signals. The smart card 203 may comprise a passive device with no transmission capability, thus the generation of the reflected signal 207, as in an RFID application, for example. The modulation of received wireless signals may correspond to data to be communicated to the reader 201, and may comprise data about the user of the smart card 203, such as credit card or other payment data, for example.

In operation, the reader 201 may transmit a wireless signal, the transmitted signal 205, which may be received, modulated and reflected back to the reader 201. In instances where the smart card 203 may be within the range of the transmitted signal 205, the smart card 203 may receive the transmitted signal 205 and modulate the signal to incorporate data that may correspond to the user of the smart card 203, for example. The signal may be reflected by the smart card 203 generating the reflected signal 207, which may be received by the reader 201. Since the frequency of the transmitted signal 205 may be high, such that the attenuation of the signal may be high, the reflected signal 207 may comprise a very low magnitude signal compared to the transmitted signal 205. In this manner, the security of the wireless system may be increased security, such that other users may not be able to intercept the reflected signal 207.

Since the reflected signal 207 may be weak, the leakage signal 209 may be significant in comparison. The leakage signal 209 may comprise the reception of the transmitted signal 205 directly, as opposed to receiving the signal after interacting with the smart card 203. By utilizing undersampling and dynamic DC biasing in the receiver section of a wireless system, the leakage signal 209 may be reduced and/or eliminated, and is described further with respect to FIG. 3.

Figure 3:
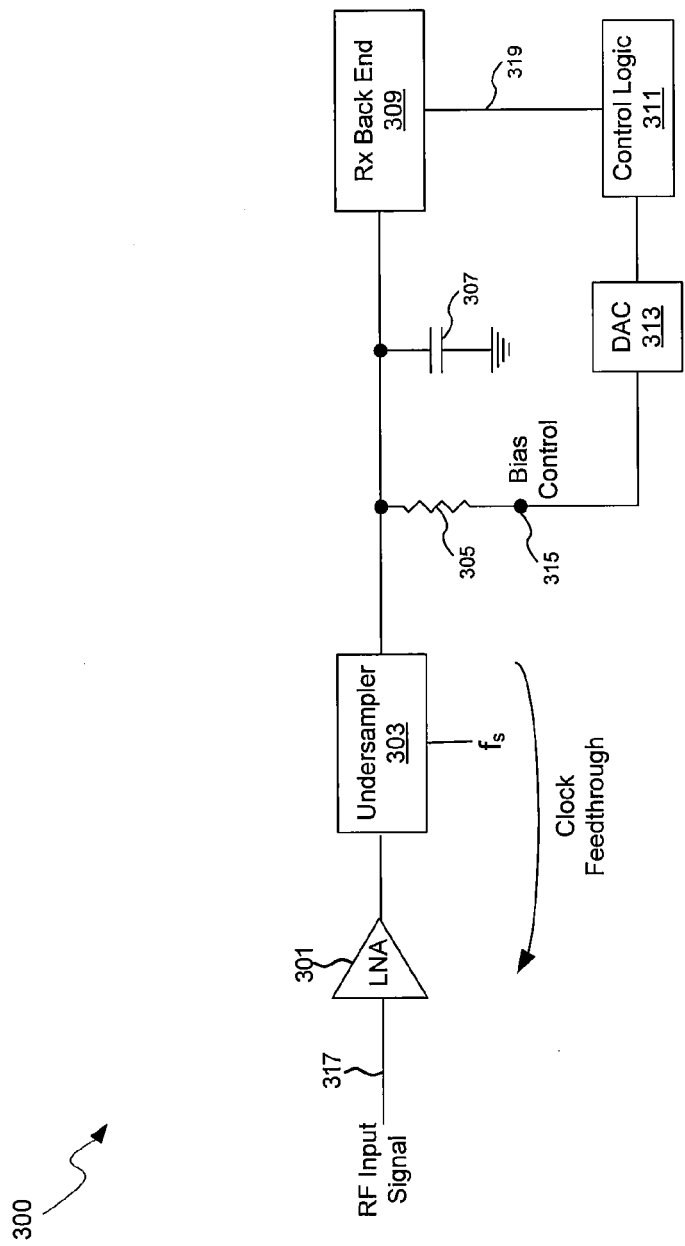
FIG. 3 is a block diagram of an exemplary leakage signal cancellation circuit, in accordance with an embodiment of the invention.

FIG. 3 is a block diagram of an exemplary leakage signal cancellation circuit, in accordance with an embodiment of the invention. Referring to FIG. 3, there is shown a low noise amplifier (LNA) 301, an undersampler 303, a resistor 305, a capacitor 307, a receiver back end 309, a control logic block 311 and a digital to analog converter (DAC) 313. There is also shown a bias sense point 315, an RF input signal 317, and a bias control signal 319.

The LAN 301 may comprise suitable circuitry, logic and/or code that may enable amplification of the received RF input signal 317. The gain of the LNA 301 may be variable, and may generate an output signal that may be communicated to the undersampler 303.

The undersampler 303 may comprise suitable circuitry, logic and/or code that may enable sampling an input signal at a sampling frequency defined by a clock signal, $f_s$. In an embodiment of the invention, the undersampler 303 may comprise a sample and hold circuit, described further with respect to FIG. 4. Undersampling may be utilized to down-convert a signal directly to baseband, as opposed to mixing down to intermediate frequencies (IF) and then mixed down again to baseband. In addition, unwanted signals that may be equal in frequency to or an integer harmonic of the clock signal, $f_s$, may be down-converted to DC. In this manner, unwanted signals may be removed by converting them to DC and then removing the DC signal. In another embodiment of the invention, the undersampler 303 may comprise a mixer.

The receiver back end 309 may comprise suitable circuitry, logic and/or code that may enable processing of baseband signals generated by the undersampler 303. The receiver back end 309 may comprise programmable gain stages and a baseband processor, for example. The receiver back end 309 may enable measurement of the magnitude of the DC bias in the signal received from the undersampler 303.

The control logic block 311 may comprise suitable circuitry, logic and/or code that may enable controlling of the bias conditions at the output of the undersampler 303. Controlling the bias conditions may comprise controlling the current through a known resistor, resistor 305, for example, to define the bias voltage at the output of the undersampler 303. The control logic block 311 may receive as an input a signal that may correspond to the magnitude of the DC signal as measured by the receiver back end 309.

The DAC 313 may comprise suitable circuitry, logic and/or code that may enable converting a digital signal to analog. The DAC 313 may receive as an input a digital signal from the control logic block 311, and generate an output signal to control bias current, indicated as the bias control point 315.

In operation, the RF input signal 317 may be communicated to the LNA 301, which may provide amplification of the signal. The amplified signal may then be undersampled by the undersampler 303. The sampling frequency, $f_s$, may correspond to a transmission frequency, or an integer sub-harmonic thereof. By undersampling at the frequency of, or an integer sub-harmonic of an undesired signal, such as a leakage signal, the undesired signal may be down-converted to DC. Thus, a DC signal at the output of the undersampler 303 may indicate the magnitude of an unwanted signal in the receiver.

The receiver back end may be enabled to measure the magnitude of the DC signal, and communicate a signal indicative of the DC magnitude to the control logic block 311. Based on the signal indicative of the DC magnitude, the control logic block 311 may then generate a bias control signal 319 that may be communicated to the DAC 313. The DAC 313 may utilize the generated bias control signal 319, for example, in a successive approximation process to control the current through the resistor 305, such that the DC magnitude of the signal received by the receiver back end 309 may be minimized, eliminated or set to a nominal level corresponding to, for example, a desired signal to noise ratio (SNR) in the receiver back end 309. In this manner, a leakage or blocker signal may be cancelled by controlling the DC bias conditions.

Figure 4:
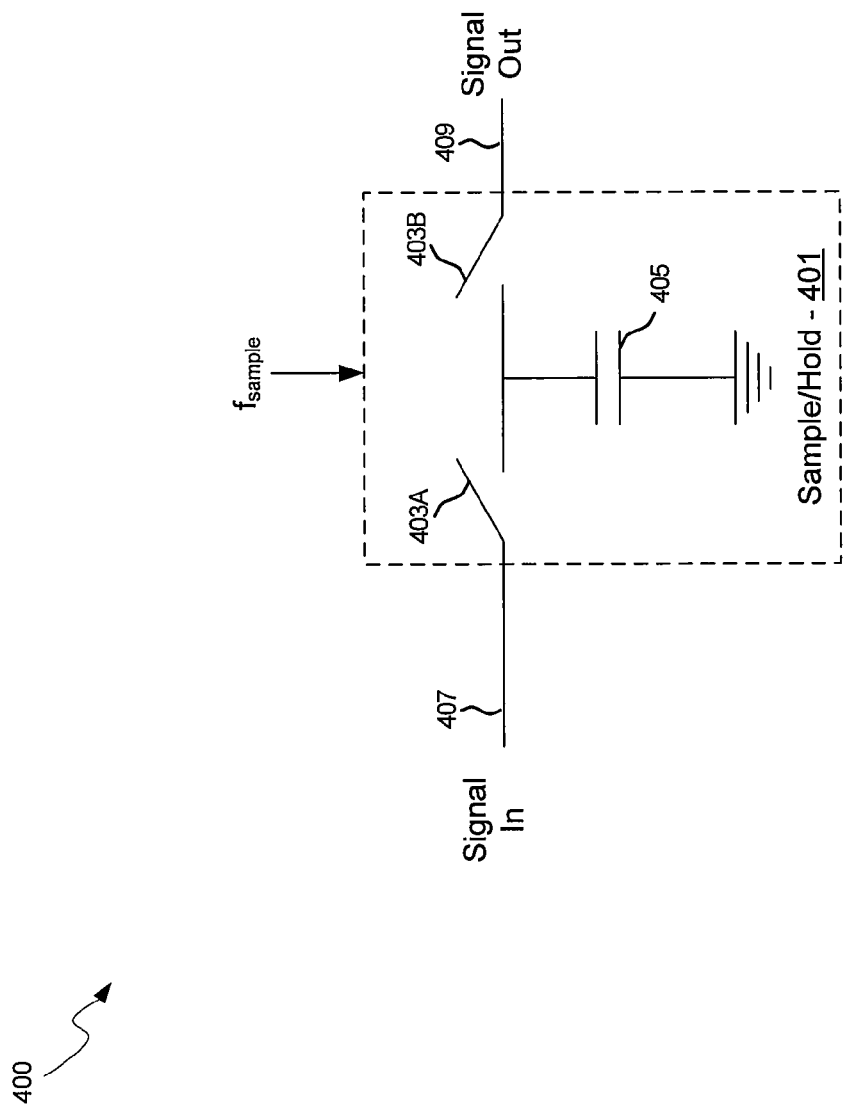
FIG. 4 is a block diagram of an exemplary undersampling circuit, in accordance with an embodiment of the invention.

FIG. 4 is a block diagram of an exemplary undersampling circuit, in accordance with an embodiment of the invention. Referring to FIG. 4, there is shown a sample and hold circuit (S/H) 401 comprising switches 403A and 403B and a capacitor 405. An input signal 407 may comprise a desired signal and a leakage signal. The leakage signal may be generated by a clock signal utilized by the wireless system, such as the short range radio 111b. The S/H circuit 401 may be enabled to sample the input signal 407 at a sampling rate determined by the clock signal, $f_{sample}$, and generate an output signal 409.

In operation, the switches 403A and 403B may be switched opened and closed at a frequency $f_{sample}$. In this manner, the input signal 407 may be undersampled and communicated to the output of the S/H circuit 401 as the output signal 409. If the sampling frequency is equal to or at an integer sub-harmonic of a leakage signal, the leakage signal may be down-converted to DC, such that the DC signal may be removed, thus removing the leakage signal, as described further with respect to FIGS. 5A and 5B.

Figure 5A:
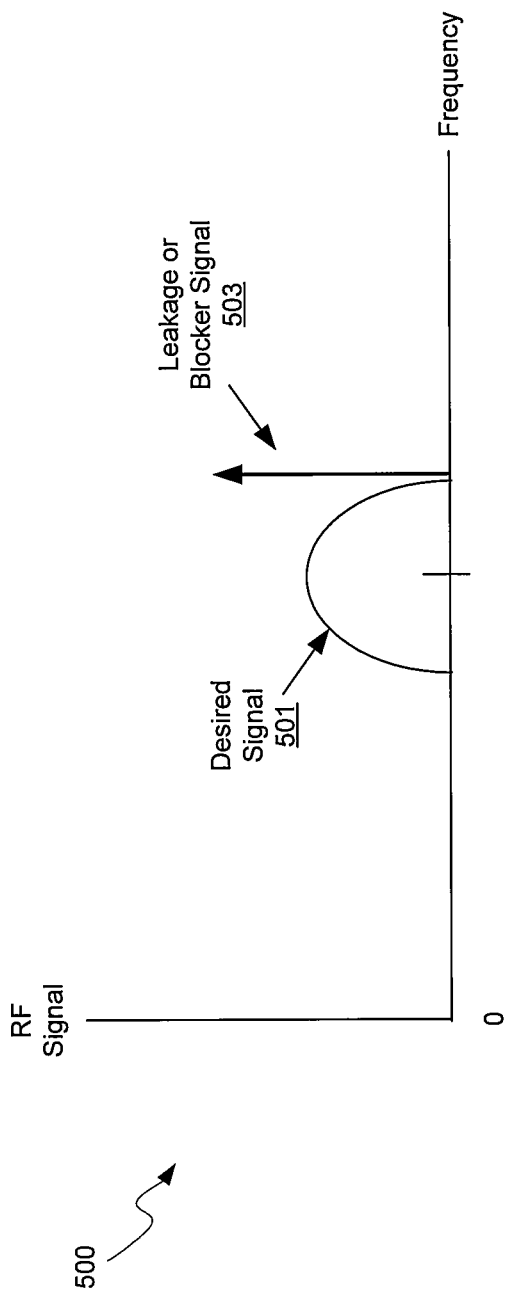
FIG. 5A is a block diagram of an exemplary undersampling process of a desired signal and a blocking signal, in accordance with an embodiment of the invention.

FIG. 5A is a block diagram of an exemplary undersampling process of a desired signal and a blocking signal, in accordance with an embodiment of the invention. Referring to FIG. 5A, there is shown an input signal spectrum 500 comprising a desired signal 501 and a leakage or blocker signal 503. The leakage or blocker signal 503 may comprise an undesirable signal from a nearby wireless source. In another embodiment of the invention, the blocker signal may comprise a leakage signal from a clock source within the wireless system. Undersampling the input signal may result in the undersampled baseband spectrum 520, as described with respect to FIG. 5B.

Figure 5B:
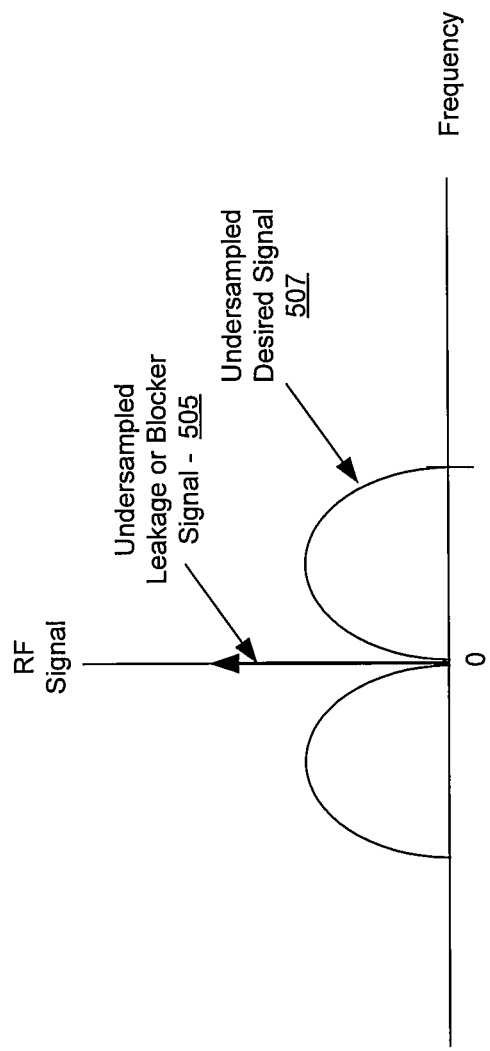
FIG. 5B is a block diagram illustrating exemplary signals resulting from an undersampling process, in accordance with an embodiment of the invention.

FIG. 5B is a block diagram illustrating exemplary signals resulting from an undersampling process, in accordance with an embodiment of the invention. Referring to FIG. 5B, there is shown an undersampled baseband spectrum 520 comprising the undersampled leakage/blocker signal 505 and the undersampled desired signal 507. By removing the undersampled leakage or blocker signal 505, the desired baseband signal, represented by the undersampled data signal 507, may be extracted. The DC undersampled leakage/blocker signal 505 may be removed by dynamically biasing the undersampled signal, as described with respect to FIG. 3.

Figure 6:
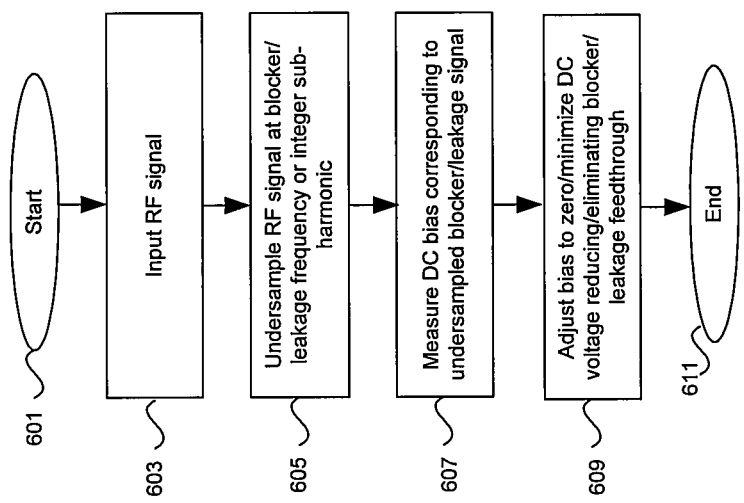
FIG. 6 is a flow chart illustrating an exemplary leakage or blockage signal rejection process, in accordance with an embodiment of the invention.

FIG. 6 is a flow chart illustrating an exemplary leakage or blockage signal rejection process, in accordance with an embodiment of the invention. Referring to FIG. 6, in step 603, after start step 601, an input RF signal may be received. In step 605, the received signal may be undersampled at a frequency that may be equal to or an integer sub-harmonic of a blocker or leakage signal. In step 607, the DC signal resulting from the undersampling of the input signal may be measured to generate a bias control signal. In step 609, the bias control signal may be utilized to dynamically adjust biasing conditions at the output of the undersampling circuit to minimize the measured DC signal, thus minimizing and/or eliminating the leakage/blocker signal.

In an exemplary embodiment of the invention, a method and system are disclosed for undersampling a received signal 317 including a desired signal 501 and an undesired signal 503. A biasing current in the wireless system 111b, 201 may be utilized to reduce a measured output DC voltage generated by the undersampling of the received signal 317. The received signal 317 may be undersampled at a frequency of or an integer sub-harmonic of the undesired signal 503, which may comprise a leakage signal and/or a blocker signal. The DC biasing condition may be controlled utilizing successive approximation, control logic 311 and a digital to analog converter 313. The DC output voltage may correspond to the undesirable signal 503, and the received signal 317 may be undersampled utilizing a mixer.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:
   in a wireless system:
      receiving an input signal comprising a desired signal and an undesired signal, said undesired signal comprising a blacker signal from another wireless system;
      undersampling said input signal, utilizing a sample and hold circuit, at a sampling frequency determined based on a frequency of said undesired signal;
      measuring a DC voltage at an output of said sample and hold circuit;
      generating a control signal at an output of a digital to analog converter based on said DC voltage; and
      adjusting a bias current to mitigate said DC voltage by applying said control signal to a first terminal of a resistor, a second terminal of said resistor connected to said output of said sample and hold circuit.

2. The method according to claim 1, wherein said sampling frequency is said frequency of said undesired signal.

3. The method according to claim 1, wherein said sampling frequency is an integer sub-harmonic of said frequency of said undesired signal.

4. The method according to claim 1, wherein said undesired signal comprises a leakage signal.

5. The method according to claim 1, wherein said adjusting said bias current is performed utilizing successive approximation.

6. The method according to claim 1, wherein said generating said control signal is performed utilizing a control logic block.

7. The method according to claim 1, wherein said DC voltage corresponds to said undesired signal.

8. A system for wireless communication, the system comprising:
   one or more circuits for use in a wireless system, wherein said one or more circuits are operable to:
      receive an input signal comprising a desired signal and an undesirable signal, said undesired signal comprising a blocker signal from another wireless system;
      undersample said input signal, utilizing a sample and hold circuit, at a sampling frequency determined based on a frequency of said undesired signal;
      measure a DC voltage at an output of said sample and hold circuit;
      generate a control signal at an output of a digital to analog converter based on said DC voltage; and
      adjust a bias current to mitigate said DC voltage by applying said control signal to a first terminal of a resistor, a second terminal of said resistor connected to said output of said sample and hold circuit.

9. The system according to claim 8, wherein said sampling frequency is said frequency of said undesired signal.

10. The system according to claim 8, wherein said sampling frequency is an integer sub-harmonic of said frequency of said undesired signal.

11. The system according to claim 8, wherein said undesired signal comprises a leakage signal.

12. The system according to claim 8, wherein said one or more circuits adjust said bias current utilizing successive approximation.

13. The system according to claim 8, wherein said one or more circuits adjust said bias current utilizing a control logic block.

14. The system according to claim 8, wherein said DC voltage corresponds to said undesired signal.

* * * * *